US006060217A

United States Patent [19]

Nguyen et al.

[11] Patent Number: 6,060,217

[45] Date of Patent: *May 9, 2000

[54] THERMAL LITHOGRAPHIC PRINTING PLATES

[75] Inventors: My T. Nguyen, Cliffwood; Nishith Merchant, North Bergen, both of N.J.; Ken-Ichi Shimazu, Briaicliff Manor, N.Y.; S. Peter Pappas, Wood Ridge; Robert Hallman, Palinskle Park, both of N.J.; Jerome Philip Kesselman, Yorktown Heights, N.Y.; Celin Savariar-Hauck, Badenhausen, Germany; Gerhard Hauck, Badenahusen, Germany; Hans-Joachim Timpe, Osterode, Germany; Omkar J. Natu, Warren; Ajay Shah, Livingston, both of N.J.

[73] Assignee: Kodak Polychrome Graphics LLC, Norwalk, Conn.

[ * ] Notice: This patent issued on a continued prosecution application filed under 37 CFR 1.53(d), and is subject to the twenty year patent term provisions of 35 U.S.C. 154(a)(2).

[21] Appl. No.: 08/922,190

[22] Filed: Sep. 2, 1997

[51] Int. Cl.[7] .......................... G03F 7/30

[52] U.S. Cl. .......................... 430/302; 430/159; 430/160; 430/165; 430/190; 430/906; 430/944

[58] Field of Search .......................... 430/302, 165, 430/166, 270.1, 906, 190, 159, 944, 160

[56] References Cited

U.S. PATENT DOCUMENTS

| | | | |
|---|---|---|---|
| 2,766,118 | 10/1956 | Sus et al. | 95/7 |
| 2,767,092 | 10/1956 | Schmidt | 95/7 |
| 2,772,972 | 12/1956 | Herrick, Jr. et al. | 96/33 |
| 2,859,112 | 11/1958 | Sus et al. | 96/91 |
| 2,907,665 | 10/1959 | Fraher | 106/49 |

(List continued on next page.)

FOREIGN PATENT DOCUMENTS

| | | | |
|---|---|---|---|
| 0 304 313 | 2/1989 | European Pat. Off. . | |
| 0 327 998 | 8/1989 | European Pat. Off. . | |
| 0 343 986 | 11/1989 | European Pat. Off. . | |
| 0 366 590 | 5/1990 | European Pat. Off. . | |
| 0 375 838 | 7/1990 | European Pat. Off. . | |
| 0 390 038 | 1/1991 | European Pat. Off. . | |
| 0 410 606 | 1/1991 | European Pat. Off. . | |
| 0 424 182 | 4/1991 | European Pat. Off. . | |
| 0 458 485 | 11/1991 | European Pat. Off. . | |
| 0 517 428 | 12/1992 | European Pat. Off. . | |
| 0 519 128 | 12/1992 | European Pat. Off. . | |
| 0 519 591 | 12/1992 | European Pat. Off. . | |
| 0 534 324 | 3/1993 | European Pat. Off. . | |
| 0 608 983 | 8/1994 | European Pat. Off. . | |
| 0 672 954 A2 | 12/1995 | European Pat. Off. | G03F 7/038 |
| 0 691 575 | 1/1996 | European Pat. Off. . | |
| 0 706 899 | 4/1996 | European Pat. Off. . | |
| 0 720 057 | 7/1996 | European Pat. Off. . | |
| 0 894 622 A2 | 7/1996 | European Pat. Off. . | |
| 0 803 771 | 10/1997 | European Pat. Off. . | |
| 0819980A1 | 1/1998 | European Pat. Off. . | |
| 0823327A2 | 2/1998 | European Pat. Off. . | |
| 0 839 647 | 5/1998 | European Pat. Off. . | |
| 0780239A3 | 8/1998 | European Pat. Off. . | |
| 0 864 419 | 9/1998 | European Pat. Off. . | |
| 0 867 278 | 9/1998 | European Pat. Off. . | |
| 4426820 | 7/1994 | Germany . | |
| 62-024241 | 2/1987 | Japan . | |
| 02010355 | 1/1990 | Japan . | |
| 207013 | 2/1995 | Japan . | |
| 07120928 | 5/1995 | Japan . | |
| 302722 | 5/1995 | Japan . | |
| 9264 | 6/1995 | Japan . | |
| 1066358 | 4/1967 | United Kingdom . | |
| 1170495 | 11/1969 | United Kingdom . | |
| 1231789 | 5/1971 | United Kingdom . | |
| 1245924 | 9/1971 | United Kingdom . | |
| 1546633 | 5/1979 | United Kingdom . | |
| 1563829 | 4/1980 | United Kingdom . | |
| 1603920 | 12/1981 | United Kingdom . | |
| 2082339 | 3/1982 | United Kingdom . | |
| 86/02743 | 5/1986 | WIPO . | |
| 91/19227 | 12/1991 | WIPO . | |
| 93/06528 | 4/1993 | WIPO . | |
| PCT/GB95/02774 | 11/1995 | WIPO | G03F 7/038 |
| 96/02491 | 2/1996 | WIPO . | |
| 96/20429 | 7/1996 | WIPO . | |
| 97/39894 | 10/1997 | WIPO . | |

OTHER PUBLICATIONS

"The Chemical Behavior of Positive Working Systems" by J.C. Strieter. Eastman Kodak Company, Rochester, New York. pp. 116–122.

*Primary Examiner*—John S. Chu
*Attorney, Agent, or Firm*—Ratner & Prestia

[57] ABSTRACT

A method for directly imaging a lithographic printing surface using infrared radiation without the requirement of pre- or post-UV-light exposure, or heat treatment employs a printing plate which contains a support with a hydrophilic surface overcoated with an imaging layer. The imaging layer contains at least one polymer having bonded pendent groups which are hydroxy, carboxylic acid, tert-butyl-oxycarbonyl, sulfonamide, amide, nitrile, urea, or combinations thereof; as well as an infrared absorbing compound. The imaging layer may contain a second polymer which has bonded pendent groups which are 1,2-napthoquinone diazide, hydroxy, carboxylic acid, sulfonamide, hydroxymethyl amide, alkoxymethyl amide, nitrile, maleimide, urea, or combinations thereof. The imaging layer may also contain a visible absorption dye, a solubility inhibiting agent, or both. In practice, the imaging layer is imagewise exposed to infrared radiation to produce exposed image areas in the imaged layer which have transient solubility in aqueous alkaline developing solution, so that solubility is gradually lost over a period of time until the imaged areas become as insoluble as non-imaged areas. Within a short time period of the imaging exposure, the imaged layer is developed with an aqueous alkaline developing solution to form the lithographic printing surface. In this method, the infrared radiation preferably is laser radiation which is digitally controlled.

20 Claims, No Drawings

U.S. PATENT DOCUMENTS

| | | | |
|---|---|---|---|
| 3,046,110 | 7/1962 | Schmidt | 96/33 |
| 3,046,111 | 7/1962 | Schmidt | 96/33 |
| 3,046,115 | 7/1962 | Schmidt et al. | 96/33 |
| 3,046,118 | 7/1962 | Schmidt | 96/33 |
| 3,046,119 | 7/1962 | Sus | 96/33 |
| 3,046,120 | 7/1962 | Schmidt et al. | 96/33 |
| 3,046,121 | 7/1962 | Schmidt | 96/33 |
| 3,046,122 | 7/1962 | Sus | 96/33 |
| 3,046,123 | 7/1962 | Sus et al. | 96/33 |
| 3,061,430 | 10/1962 | Uhlig et al. | 96/33 |
| 3,102,809 | 9/1963 | Endermann et al. | 96/33 |
| 3,105,465 | 10/1963 | Peters | 122/37 |
| 3,628,953 | 12/1971 | Brinkman | 96/36.3 |
| 3,635,709 | 1/1972 | Kobayashi | 96/33 |
| 3,647,443 | 3/1972 | Rauner et al. | 96/33 |
| 3,837,860 | 9/1974 | Roos | 96/91 D |
| 3,859,099 | 1/1975 | Petropoulos et al. | 96/90 R |
| 3,891,439 | 6/1975 | Katz et al. | 96/49 |
| 3,902,906 | 9/1975 | Iwama et al. | 96/115 R |
| 4,063,949 | 12/1977 | Uhlig et al. | 96/27 E |
| 4,306,010 | 12/1981 | Uehara et al. | 430/190 |
| 4,306,011 | 12/1981 | Uehara et al. | 430/190 |
| 4,308,368 | 12/1981 | Kubo et al. | 525/504 |
| 4,356,254 | 10/1982 | Takashi et al. | 430/296 |
| 4,493,884 | 1/1985 | Nagano et al. | 430/192 |
| 4,497,888 | 2/1985 | Nishioka et al. | 430/165 |
| 4,529,682 | 7/1985 | Toukhy | 430/190 |
| 4,544,627 | 10/1985 | Takashi et al. | 430/325 |
| 4,576,901 | 3/1986 | Stahlhofen et al. | 430/325 |
| 4,609,615 | 9/1986 | Yamashita | 430/325 |
| 4,684,599 | 8/1987 | DoMinh et al. | 430/270 |
| 4,693,958 | 9/1987 | Schwatrz et al. | 430/302 |
| 4,708,925 | 11/1987 | Newman | 430/270 |
| 4,789,619 | 12/1988 | Ruckert et al. | 430/270 |
| 4,927,741 | 5/1990 | Garth et al. | 430/309 |
| 4,966,798 | 10/1990 | Brosius et al. | 428/64 |
| 5,002,853 | 3/1991 | Aoai et al. | 430/281 |
| 5,085,972 | 2/1992 | Vogel | 430/270 |
| 5,130,223 | 7/1992 | Nishimura et al. | 430/166 |
| 5,145,763 | 9/1992 | Bassett et al. | 430/169 |
| 5,149,613 | 9/1992 | Stahlhofen et al. | 430/296 |
| 5,200,292 | 4/1993 | Shinozaki et al. | 430/296 |
| 5,200,298 | 4/1993 | Takagi et al. | 430/264 |
| 5,202,221 | 4/1993 | Imai et al. | 430/283 |
| 5,208,135 | 5/1993 | Patel et al. | 430/281 |
| 5,227,473 | 7/1993 | Kawamura et al. | 534/557 |
| 5,279,918 | 1/1994 | Nishi et al. | 430/190 |
| 5,286,612 | 2/1994 | Tefler | 430/335 |
| 5,340,699 | 8/1994 | Haley et al. | 430/302 |
| 5,368,977 | 11/1994 | Yoda et al. | 430/190 |
| 5,372,907 | 12/1994 | Haley et al. | 430/157 |
| 5,372,915 | 12/1994 | Haley et al. | 430/302 |
| 5,372,917 | 12/1994 | Tsuchida et al. | 430/343 |
| 5,380,622 | 1/1995 | Roser | 430/343 |
| 5,437,952 | 8/1995 | Hirai et al. | 430/83 |
| 5,441,850 | 8/1995 | Marshall et al. | 430/336 |
| 5,466,557 | 11/1995 | Haley et al. | 430/278 |
| 5,491,046 | 2/1996 | DeBoer et al. | 430/302 |
| 5,631,119 | 5/1997 | Shinozaki | 430/326 |
| 5,641,608 | 6/1997 | Grunwald et al. | 430/302 |
| 5,658,708 | 8/1997 | Kondo | 430/288.1 |
| 5,705,308 | 1/1998 | West et al. | 430/165 |
| 5,705,309 | 1/1998 | West et al. | 430/944 |
| 5,705,322 | 1/1998 | West et al. | 430/944 |
| 5,725,994 | 3/1998 | Kondo | 430/302 |
| 5,731,123 | 3/1998 | Kawamura et al. | 430/176 |
| 5,741,619 | 4/1998 | Aoshima et al. | 430/302 |
| 5,759,742 | 6/1998 | West et al. | 430/302 |
| 5,786,125 | 7/1998 | Tsuchiya et al. | 430/272.1 |
| 5,840,467 | 11/1998 | Kitatani et al. | 430/165 |
| 5,858,626 | 1/1999 | Sheriff et al. | 430/326 |

THERMAL LITHOGRAPHIC PRINTING PLATES

BACKGROUND OF THE INVENTION

1. Field of the Invention

This invention relates to lithographic printing plates and their process of use. More particularly, this invention relates to lithographic printing plates which can be digitally imaged by infrared laser light.

2. Description of Related Art

Conventional lithographic printing plates typically have a radiation sensitive, oleophilic image layer coated over a hydrophilic underlayer. The plates are imaged by imagewise exposure to actinic radiation to produce imaged areas which are either soluble (positive working) or insoluble (negative working) in a developer liquid. During development of the imaged plate, the soluble areas are removed by the developer liquid from underlying hydrophilic surface areas to produce a finished plate with ink receptive oleophilic image areas separated by complimentary, fountain solution receptive hydrophilic areas. During printing, a fountain solution is applied to the imaged plate to wet the hydrophilic areas, so as to insure that only the oleophilic image areas will pick up ink for deposition on the paper stock as a printed image. Conventional lithographic printing plates typically have been imaged using ultraviolet radiation transmitted imagewise through a suitable litho film in contact with the surface of the printing plate.

With the advent of digitally controlled imaging systems using infrared lasers, printing plates which can be imaged thermally have been developed to address the emerging industry need. In such thermally imaged systems the radiation sensitive layer typically contains a dye or pigment which absorbs the incident infrared radiation and the absorbed energy initiates the thermal reaction to produce the image. However, each of these thermal imaging systems requires either a pre- or post-baking step to complete image formation, or blanket pre exposure to ultraviolet radiation to activate the layer.

Examples of radiation sensitive compositions and their use in making lithographic printing plates are disclosed in U.S. Pat. Nos. 4,708,925; 5,085,972; 5,286,612; 5,372,915; 5,441,850; 5,491,046; 5,340,699; and 5,466,557. European Patent Application 0 672 954 A2; and PCT/GB95/02774.

U.S. Pat. No. 5,372,915 is an example of a printing plate containing a radiation sensitive composition which is comprised of a resole resin, a novolac resin, a latent Broensted acid and an infrared absorber. In the preparation of a lithographic printing plate, the radiation sensitive composition is imagewise exposed to activating infrared radiation and the exposed areas of the printing plate are removed with an aqueous alkaline developing solution. Related U.S. Pat. No. 5,340,699 discloses the preparation of a lithographic printing plate using the same radiation sensitive composition as in U.S. Pat. No. 5,372,915. But in this related patent the radiation sensitive composition is imagewise exposed to activating radiation, and then the printing plate is heated to provide reduced solubility in exposed areas and increased solubility in unexposed areas. The unexposed areas of the printing plate are then removed with an aqueous alkaline developing solution. Although the composition is the same, a positive or a negative lithographic image is produced in each respective patent by varying the activating radiation and adding a blanket heating step.

PCT/GB95/02774 is an example of forming a negative lithographic image from a positive working photosensitive composition comprising a naphthoquinone diazide ester and a phenolic resin. In the disclosed method the photosensitive composition is first uniformly exposed to ultraviolet radiation to render the composition developable. The plate is then imaged with an infrared laser to insolubilize the imaged areas. Those areas not exposed by the laser are then removed with a developer.

While advances have been made to provide negative working printing plates with infrared laser radiation, there continues to be a need for a simplified process to manufacture long-run positive working lithographic printing plates.

SUMMARY OF THE INVENTION

These needs are met by the positive working plate forming process of this invention which is a method for forming a lithographic printing surface consisting essentially of the following steps carried out in the order given:

(a) providing a lithographic printing plate comprising a support having a hydrophilic surface and an imaging layer applied to the hydrophilic surface, the imaging layer comprising;
  (1) a polymer having a plurality of pendent groups bonded thereto wherein the pendent groups are selected from the group consisting of hydroxy, carboxylic acid, sulfonamide, amide, nitrile, urea, and combinations thereof; and
  (2) an infrared absorbing compound;

(b) imagewise exposing the imaging layer to infrared radiation to produce exposed image areas which have transient solubility in an aqueous alkaline developing solution; and, (c) contacting the imaging layer with the aqueous alkaline developing solution to remove the exposed image areas from the hydrophilic surface to form the lithographic printing surface comprised of unexposed image areas. Preferably, the imaging layer is contacted with the aqueous alkaline developing solution within a time period of 20 hours from the imagewise exposing of the imaging layer.

An added embodiment of this invention is a lithographic printing plate comprising a support and an imaging layer consisting essentially of (1) a polymer having a plurality of pendent groups bonded thereto wherein the pendent groups are selected from the group consisting of hydroxy, carboxylic acid, sulfonamide, amide, nitrile, urea, and combinations thereof;

(2) an infrared absorbing compound; and optionally, (3) a visible absorption dye, a solubility inhibiting agent, or a combination thereof.

A further embodiment of this invention is a lithographic printing plate comprising a support and an imaging layer consisting essentially of (1) a second polymer selected from the group consisting of a novolac resin, a butylated thermosetting phenolic resin, poly(vinyl phenol-co-2-hydroxyethyl methacrylate), and a co-polymer based on methacrylamide, acrylonitrile, methylmethacrylate, and the reaction product of methacryloxyethylisocyanate with aminophenol;

(2) a napthoquinone diazide polymer which is a condensation polymer of pyrogallol and acetone having a plurality of pendent 1,2-napthoquinone diazide groups bonded to the condensation polymer through a sulfonyl ester linkage;

(3) an infrared absorbing compound; and optionally, (4) a visible absorption dye, an iodonium salt, or a combination thereof.

DETAILED DESCRIPTION OF THE INVENTION

This invention relates to a method for directly imaging a lithographic printing surface using infrared radiation without the requirement of pre- or post-UV-light exposure, or heat treatment. This method employs a printing plate which comprises a support with a hydrophilic surface and an imaging layer coated over that hydrophilic surface. The imaging layer contains at least one polymer having a plurality of pendent groups bonded thereto which are selected from the group consisting of hydroxy, carboxylic acid, tert-butyl-oxycarbonyl, sulfonamide, amide, nitrite, urea, and combinations thereof, and an infrared absorbing compound. The imaging layer may contain a second polymer which has a plurality of pendent groups bonded thereto which are selected from the group consisting of 1,2-napthoquinone diazide, hydroxy, carboxylic acid, sulfonamide, hydroxymethyl amide, alkoxymethyl amide, nitrite, maleimide, urea, and combinations thereof. The imaging layer may also contain a visible absorption dye, a solubility inhibiting agent, or a combination thereof. In the method of this invention, the imaging layer is imagewise exposed to infrared radiation to produce exposed image areas in the imaged layer. These exposed image areas have the unusual characteristic of transient solubility in an aqueous alkaline developing solution so that solubility is gradually lost over a period of time until the imaged areas become as insoluble as non-imaged areas. Consequently, the imaged layer is contacted with an aqueous alkaline developing solution within a time period of 20 hours or less of the imaging exposure, and preferably within about 120 minutes of exposure. Development with the developing solution removes the exposed image areas from the hydrophilic surface to form the lithographic printing surface comprised of unexposed image areas and complimentary uncovered areas of the hydrophilic surface. In this method, the infrared radiation preferably is laser radiation and is digitally controlled.

Lithographic Printing Plate

The lithographic printing plate used in the method of this invention, comprises a support which has a hydrophilic surface, and an imaging layer which is coated over the hydrophilic surface. The imaging layer contains at least one polymer having a plurality of pendent groups bonded thereto which are selected from the group consisting of 1,2-napthoquinone diazide, hydroxy, carboxylic acid, tert-butyl-oxycarbonyl, sulfonamide, hydroxymethyl amide, alkoxymethyl amide, urea, and combinations thereof; and an infrared absorbing compound. The imaging layer may contain a second polymer having reactive pendent groups selected from the group consisting of hydroxy, carboxylic acid, tert.-butyloxycarbonyl, sulfonamide, hydroxymethyl amide, and alkoxymethyl amide. The imaging layer may also contain a visible absorbing dye to provide a contrast image to the undeveloped layer; as well as a solubility inhibiting agent to reduce the solubility of unexposed areas of the layer.

The imaging layer contains at least one polymer having a plurality of pendent groups bonded thereto which are selected from the group consisting of hydroxy, carboxylic acid, sulfonamide, amide, nitrile, urea, and combinations thereof; and an infrared absorbing compound and may contain a second different polymer of the same class to provide supplementary properties to the imaging layer. The polymer may be a condensation polymer such as phenolic resins, or it may be a free radical addition polymer such as acrylics, vinyl polymers and the like. The term "hydroxy" as used herein is intended to include both aryl hydroxy and alkyl hydroxy groups. Preferred polymers for use in the imaging layer either individually or in combination include phenolic polymers such as butylated thermoseting phenolic resin, novolac resins such as novolac PD-140A (a product of Borden Chemical, Mass.), and the like; acrylic polymers such as poly(vinyl phenol-co-2-hydroxyethyl methacrylate). Preferred condensation polymers, are condensation polymers of phenolic compounds with carbonyl compounds. Suitable phenolic compounds include phenol, chatechol, pyrogallol, alkylated phenols such as cresols, alkoxylated phenols and the like. Suitable carbonyl compounds include formaldehyde, acetone, and the like. Such condensation polymers include novolac resins and resole resins which are condensation products of the phenolic compounds with formaldehyde. Useful free radical addition polymers include poly(4-hydroxystyrene), poly(4-hydroxystyrene/methylmethacrylate), poly(styrenes butylmethacrylate/methylmethacrylate/methacrylic acid), poly(butylmethacrylate/methacrylic acid), poly(vinylphenol/2-hydroxyethyl-methacrylate), poly(styrene/n-butyl-metacrylate/2-hydroxyethyl-methacrylate/methacrylic acid), poly(N-methoxymethyl-methylacrylamide/2-phenylethylmethacrylate/methacrylic acid), poly(styrene/ethyl-methacrylate/2-hydroxy-ethylmethacrylate/methacrylic acid), acrylic and vinyl polymers containing a plurality of pendent 1,2-napthoquinone diazide groups, and the like.

The imaging layer may contain a second polymer to supplement properties imparted by the first polymer. The second polymer has a plurality of pendent groups bonded thereto which are selected from the group consisting of 1,2-napthoquinone diazide, hydroxy, carboxylic acid, sulfonamide, hydroxymethyl amide, alkoxymethyl amide, nitrile, maleimide, urea, and combinations thereof. Many embodiments of the second polymer are the same embodiments as described supra in reference to the first polymer. However, several distinct embodiments are possible in the second polymer, most notably with the presence of pendent 1,2-napthoquinone diazide groups. 1,2-napthoquinone diazide polymers preferably are condensation phenolic polymers having a plurality of pendent 1,2-napthoquinone diazide groups bonded to the condensation polymer through a sulfonyl ester linkage. Preferred condensation polymers, are condensation polymers of phenolic compounds with carbonyl compounds. Suitable phenolic compounds include phenol, chatechol, pyrogallol, alkylated phenols such as cresols, alkoxylated phenols and the like. Suitable carbonyl compounds include formaldehyde, acetone, and the like. Such condensation polymers include novolac resins and resole resins which are condensation products of the phenolic compounds with formaldehyde. Suitable 1,2-napthoquinone diazide polymers are polymers, particularly phenolic condensation polymers, which have a plurality of pendent 1,2-napthoquinone diazide groups bonded to the polymer along with a plurality of hydroxy groups. Particularly useful polymers in formulating the napthoquinone diazide polymer, are condensation polymers of a phenolic compound with a carbonyl compound as described supra. The pendent 1,2-napthoquinone diazide groups typically are bonded to the phenolic polymer through an ester linkage particularly through a sulfonyl ester linkage. Suitable 1,2-napthoquinone diazide polymers of this type include those disclosed in U.S. Pat. No. 3,635,709 the disclosure of which is incorporated herein by reference. A particularly preferred 1,2-napthoquinone diazide polymer disclosed in example 1 of this patent, is the condensation polymer of pyrogallol and acetone having a plurality of pendent 1,2-napthoquinone diazide groups bonded to the condensation polymer through a sulfonyl ester linkage.

The imaging layer of this invention also requires, as a component, an infrared absorber to render the layer sensitive to infrared radiation and cause the printing plate to be imageable by exposure to a laser source emitting in the infrared region. The infrared absorbing compound may be a dye and/or pigment, typically having a strong absorption band in the region between 700 nm and 1400 nm, and preferably in the region between 780 nm and 1300 nm. A wide range of such compounds is well known in the art and include dyes and/or pigments selected from the group consisting of triarylamine dyes, thiazolium dyes, indolium dyes, oxazolium dyes, cyanine dyes, polyaniline dyes, polypyrrole dyes, polythiophene dyes, thiolene metal complex dyes, carbon black, and polymeric phthalocyanine blue pigments. Examples of the infrared dyes employed in the imaging layer are Cyasorb IR99 (available from Glendale Protective Technology), Cyasorb IR165 (available from Glendale Protective Technology), Epolite III-178 (available from Epoline), Epolite IV-62B (available from Epoline), PINA-780 (available from Allied Signal) and SpectraIR830A (available from Spectra Colors Corp.), SpectraIR840A (available from Spectra Colors Corp.). The infrared absorber is used in the imaging layer in an amount from about 0.2 to about 30 weight percent, percent and preferably from about 0.5 to about 20 weight percent, based on the weight of the composition.

An optional indicator dye is typically added to the imaging layer to provide a visual image on the exposed plate prior to inking or mounting on the press. Suitable indicator dyes for this purpose include Basic Blue 7, CI Basic Blue 11, CI Basic Blue 26, CI Disperse Red 1, CI Disperse Red 4, Cl Disperse Red 13, Victoria Blue R, Victoria Blue BO, Solvent Blue 35, Ethyl Violet, and Solvent Blue 36. Preferably the imaging layer contains an indicator dye which is present in an amount of about 0.05 to about 10 weight percent and preferably from about 0.1 to about 5 weight percent, based on the weight of the composition.

A solubility inhibiting agent may be added to the imaging layer to reduce the solubility of unexposed areas of the layer in a developer solution for the imaged plate. Useful solubility inhibiting agents include cationic onium salts such as iodonium salts, ammonium salts, sulfonium salts and the like. Preferred agents of this class include diaryliodonium salts such as 2-hydroxy-tetradecyloxyphenyl-phenyliodonium hexafluoroantimonate (available as CD1012 from Sartomer Company, Exton, Pa.); quinolinium and isoquinolinium salts such as N-benzyl quinolinium bromide; triarylsulfonium salts, and the like.

The compositions for use in this invention may be readily coated on a smooth or grained-surface aluminum substrate to provide printing plates especially useful for lithographic printing process. However, polymeric or paper sheet substrates may likewise be used provided the sheet substrate has a hydrophilic surface. Such polymeric substrates include dimensionally stable sheets of polyethylene terephthalate, polycarbonate and the like.

To form printing plates of this invention, the compositions typically may be dissolved in an appropriate solvent or solvent mixture, to the extent of about 5 to 15 weight percent based on the weight of the composition. Appropriate solvents or solvent mixtures include methyl ethyl ketone, methyl isobutyl ketone, 2-ethoxyethanol, 2 butoxyethanol, methanol, isobutyl acetate, methyl lactate, etc. Desirably, the coating solution will also contain a typical silicone-type flow control agent. The sheet substrate, typically aluminum, may be coated by conventional methods, e.g., roll, gravure, spin, or hopper coating processes, at a rate of about 5 to 15 meters per minute. The coated plate is dried with the aid of an airstream having a temperature from about 60 to about 100° C. for about 0.5 to 10 minutes. The resulting plate will have an imaging layer having a thickness preferably between about 0.5 and about 3 micrometers.

A preferred lithographic printing plate of this invention comprises a support and an imaging layer consisting essentially of a phenolic polymer having a plurality of pendent groups bonded thereto wherein the pendent groups are selected from the group consisting of hydroxy, carboxylic acid, sulfonamide, amide, nitrite, urea, and combinations thereof; an infrared absorbing compound; and optionally, a visible absorption dye, a solubility inhibiting agent, or a combination thereof. An equally preferred lithographic printing plate of this invention comprises a support and an imaging layer consisting essentially of a napthoquinone diazide polymer which is a condensation polymer of pyrogallol and acetone having a plurality of pendent 1,2-napthoquinone diazide groups bonded to the condensation polymer through a sulfonyl ester linkage; a polymer selected from the group consisting of a novolac resin, a butylated thermosetting phenolic resin, poly(vinyl phenol-co-2-hydroxyethyl methacrylate), and a co-polymer based on methacrylamide, acrylonitrile, methylmethacrylate, and the reaction product of methacryloxyethylisocyanate with aminophenol; an infrared absorbing compound; and optionally, a visible absorption dye, a solubility inhibiting agent, or a combination thereof. In each of these embodiments the solubility inhibiting agent when present, preferably is an iodonium salt or an ammonium salt.

Preparation of a Lithographic Printing Surface

In the method of this invention, a lithographic printing surface is prepared using a lithographic printing plate as described supra.

The lithographic printing plates of this invention are imagewise exposed by a radiation source that emits in the infrared region. i.e., between about 700 nm and about 1,400 nm. Preferably, the infrared radiation is laser radiation. Such laser radiation may be digitally controlled to imagewise expose the imaging layer. In this context, the lithographic printing plates of this invention are uniquely adapted for "direct-to-plate" imaging. Direct-to-plate systems utilize digitized information, as stored on a computer disk or computer tape, which is intended to be printed. The bits of information in a digitized record correspond to the image elements or pixels of the image to be printed. The pixel record is used to control an exposure device which may, for example, take the form of a modulated laser beam. The position of the exposure beam, in turn, may be controlled by a rotating drum, a leadscrew, or a turning mirror. The exposure beam is then turned off in correspondence with the pixels to be printed. The exposing beam is focused onto the imaging layer of the unexposed plate.

During the writing operation, the plate to be exposed is placed in the retaining mechanism of the writing device and the write laser beam is scanned across the plate and digitally modulated to generate an image on the surface of the lithographic plate. When an indicator dye is present in the imaging layer a visible image is likewise produced on the surface of the plate.

During imaging exposure, exposed areas of the imaging layer are solubilized and can be removed with an alkaline developing solution. Surprisingly, this solubility of exposed image areas solubility is gradually lost over a period of time until the exposed areas become difficult to develop resulting in ink pick up or toning during printing. Since developability of the exposed image areas is transient, the imaged layer should be contacted with an aqueous alkaline developing solution within the transient time period, typically 20 hours or less of the imaging exposure, and preferably within about 120 minutes of exposure. Most preferably, the imaged lithographic plate is developed immediately after the imaging exposure.

The imaged lithographic printing plate of this invention is either hand developed or machine developed within the transient time period using conventional aqueous, alkaline developing solutions. Useful aqueous alkaline developers containing an amphoteric surfactant are disclosed in U.S. Pat. No. 3,891,439 the disclosure of which is incorporated herein by reference. Preferred aqueous developing solutions are commercially available and include Polychrome® PC-952; Polychrome® PC-9000; Polychrome® PC3955; Polychrome® 4005; Polychrome® 3000; and the like. (Polychrome is a registered trademark of the Polychrome Corporation, Fort Lee, N.J.) After development with the aqueous alkaline developing solution the printing plate typically is treated with a conventional finisher such as gum arabic.

The positive lithographic plates and surfaces of this invention and their method of use will now be illustrated by the following examples but is not intended to be limited thereby.

EXAMPLE 1

The polymeric coating solution was prepared by dissolving 1.0 g 1,2-napthoquinone diazide polymer which is a condensation polymer of pyrogallol and acetone, and the 1,2-napthoquinone diazide groups are bonded to the phenolic polymer through a sulfonyl ester linkage (hereinafter P3000, available from Polychrome), 0.6 g butylated, thermoseting phenolic resin (GPRI-7550, available from Georgia Pacific), 0.3 g Epolite III-178 infrared absorbing dye (available from Epolin, Inc., Newark, N.J.) and 0.02 g Victoria Blue BO into 30 g solvent mixture containing 22% methyl ethyl ketone, 33% methyl isobutyl ketone, 22% ethyl cellosolve, 33% isobutyl acetate and a trace amount of FC430 surfactant. The solution was spin coated on the EG-aluminum substrate at 85 rpm and dried at 60° C. for 3 minutes to produce a uniform polymeric coating having a coating weight between 1.0 and 1.5 g/m$^2$.

The plate was imaged on the Gerber Crescent 42T thermal plate setter, which is equipped with a YAG laser having a wavelength at around 1064 nm, at an energy density between 200 and 400 mJ/cm$^2$. The plate was then developed immediately after exposure with Polychrome aqueous developer PC-9000 to produce a high resolution printing image.

EXAMPLE 2

The polymeric coating solution was prepared similar to example 1, except that Epolite 62B infrared absorbing dye (available from Epolin, Inc., Newark, N.J.) was used to replace Epolite III-178. The solution was spin coated on the EG-aluminum substrate at 85 rpm and dried at 60° C. for 3 minutes to produce a uniform polymeric coating having a coating weight between 1.0 and 1.5 g/m$^2$.

The plate was imaged on the Creo-Trendsetter thermal plate setter, which is equipped with diode lasers having a wavelength at around 830 nm, at an energy density between 200 and 400 mJ/cm$^2$. The plate was then developed immediately with Polychrome aqueous developer PC-9000 to produce a high resolution printing image.

EXAMPLE 3

The polymeric coating solution was prepared similar to Example 1, except that 0.6 g Resyn 28-2930 carboxylated vinyl acetate terpolymer (a product of National Starch and Chemical Corp.) was used to replace the GPRI-7550 phenolic resin. The solution was spin coated on the EG-aluminuin substrate at 85 rpm and dried at 60° C. for 3 minutes to produce a uniform polymeric coating having a coating weight between 1.0 and 1.5 g/m$^2$.

The plate was imaged on the Gerber Crescent 42T thermal plate setter, which is equipped with a YAG laser having a wavelength at around 1064 nm, at an energy density between 200 and 400 mJ/cm$^2$. The plate was then developed immediately with Polychrome aqueous developer PC-9000 to produce a high resolution printing image.

EXAMPLE 4

The polymeric coating solution was prepared similar to Example 1, except that 0.6 g poly(vinylphenol-co-2-hydroxyethylmethacrylate) was used to replace GPRI-7550 resin. The solution was spin coated on the EG-aluminum substrate at 85 rpm and dried at 60° C. for 3 minutes to produce a uniform polymeric coating having a coating weight between 1.0 and 1.5 g/m$^2$.

The plate was imaged on the Gerber Crescent 42T thermal plate setter, which is equipped with a YAG laser having a wavelength at around 1064 nm, at an energy density between 200 and 400 mJ/cm$^2$. The plate was then developed immediately with Polychrome aqueous developer PC-9000 to produce a high resolution printing image.

EXAMPLE 5

The polymeric coating solution was prepared by dissolving 3.0 g P3000 polymer of Example 1, 1.0 g GPRI-7550 phenolic resin, 3.0 g Resyn 28-2930, 0.9 g Epolite III-178 infrared dye and 0.05 g Victoria Blue BO into 30 g solvent mixture containing 22% methyl ethyl ketone, 33% methyl isobutyl ketone, 22% ethyl cellosolve, 33% isobutyl acetate and a trace amount of FC430 surfactant. The solution was spin coated on the EG-aluminum substrate at 85 rpm and dried at 60° C. for 3 minutes to produce a uniform polymeric coating having a coating weight between 1.0 and 1.5 g/m$^2$.

The plate was imaged on the Gerber Crescent 42T thermal plate setter. which is equipped with a YAG laser having a wavelength at around 1064 nm. at an energy density between 200 and 400 mJ/cm$^2$. The plate was then developed immediately with Polychrome aqueous developer PC-9000 to produce a high resolution printing image.

EXAMPLE 6

The polymeric coating solution was prepared by dissolving 0.4 g P3000 polymer, 5.6 g SD140A novolac phenolic resin (available from Borden Chemicals, Mass.), 0.8 g 2-hydroxy-tetradecyloxyphenylphenyliodonium hexafluoroantimonate (hereinafter CD1012 available from Sartomer), 0.6 g SpectraIR830A infrared dye (available from Spectra Colors Corp.) and 0.2 g Solvent Blue 35 into 80 g solvent mixture containing 22% methyl ethyl ketone, 33% methyl isobutyl ketone, 22% ethyl cellosolve, 33% isobutyl acetate and a trace amount of FC430 surfactant. The solution was spin coated on the EG-aluminum substrate at 85 rpm and dried at 60° C. for 4 minutes to produce a uniform polymeric coating having a coating weight between 1.0 and 1.5 g/m$^2$.

The plate was imaged on the Creo-Trendsetter thermal plate setter, which is equipped with multiple diode laser beam having a wavelength at around 830 nm, at an energy density between 160 and 400 mJ/cm$^2$. The plate was then developed immediately with Polychrome aqueous developer PC3955 to produce a high resolution printing image.

EXAMPLE 7

A polymeric coating solution was prepared by dissolving 6.0 g SD140A novolac resin, 0.8 g 2hydroxytetradecyloxyphenylphenyliodonium hexafluoroantimonate (CD1012), 0.6 g SpectraIR830A infrared dye (available from Spectra Colors Corp.) and 0.2 g Solvent Blue 35 into 80 g solvent mixture containing 22% methyl ethyl ketone, 33% methyl isobutyl ketone, 22% ethyl cellosolve, 33% isobutyl acetate and a trace amount of FC430 surfactant. The solution was spin coated on the EG-aluminum substrate at 85 rpm and dried at 60° C. for 4 minutes to produce a uniform polymeric coating having a coating weight between 1.0 and 1.5 g/m$^2$.

The plate was imaged on the Creo-Trendsetter thermal plate setter, which is equipped with multiple diode laser beam having a wavelength at around 830 nm, at an energy densitn, between 160 and 400 mJ/cm$^2$. The plate was then developed immediately with Polychrome aqueous developer C110 to produce a high resolution printing image.

EXAMPLE 8

A polymeric coating was prepared by dissolving 0.4 g ADS 1060A IR near infrared absorbing dye (available from ADS Canada), 0.05 g ethyl violet, 0.6 g Uravar FN6 resole phenolic resin (available from DSM, Netherlands), 1.5 g PMP-92 co-polymer (PMP-92 co-polymer is based on methacrylamide, N-phenyl-maleimide, and APK which is methacryloxyethylisocyanate reacted with aminophenol (available from Polychrome Corporation), and 7.45 g PD140A novolac resin (available from Borden Chemicals, Mass.) into 100 g solvent mixture containing 15% Dowanol PM, 40% 1,3-dioxolane and 45% methanol. The solution was coated with a wire wound bar onto an EG-aluminum substrate and dried at 100° C. for 5 minutes to produce a uniform polymeric coating having a coating weight of 1.8 to 2.2 g/m$^2$.

The plate was imaged on a Gerber Crescent 42T thermal plate setter, which is equipped with a YAG laser producing radiation with a wavelength at about 1064 nm, and an energy density between 200 and 400 mj/cm$^2$ using a UGRA/FOGRA Postscript Control Strip version 1.1EPS. The plate was then immediately developed using Polychrome® 3000 aqueous developer to produce a high resolution printing image. The plate was then gummed with Polychrome® 850S standard gum and put on a Roland Favorit press to produce 70,000 good prints.

EXAMPLE 9

A polymeric coating was prepared by dissolving 0.2 g SpectraIR830 dye (available from Spectra Colors Corp., Kearny. N.J.), 0.05 g ethyl violet, 0.6 g Uravar FN6 resole resin, 1.5 g PMP-65 co-polymer (PMP-65 co-polymer is based on methacrylamide, acrylonitrile, methylmethacrylate, and APK which is methacryloxyethylisocyanate reacted with aminophenol (available from Polychrome Corporation), and 7.65 g PD140A novolac resin, into 100 g solvent mixture containing 15% Dowanol PM, 40% 1,3-dioxolane and 45% methanol. The solution was coated with a wire wound bar onto an EG-aluminum substrate and dried at 100° C. for 5 minutes to produce a uniform polymeric coating having a coating weight of 1.8 to 2.2 g/m$^2$.

The plate was imaged on a Creo-Trendsetter thermal plate setter, which is equipped with multiple diode laser beams producing radiation with a wavelength at about 830 nm, and an energy density between 160 and 400 mJ/cm$^2$ using a UGRA/FOGRA Postscript Control Strip version 1.1EPS. The plate is then immediately developed using Polychrome® 3000 aqueous developer to produce a high resolution printing image.

EXAMPLE 10

A polymeric coating was prepared by dissolving 8.7 g PD140A novolac resin, 0.8 g ST 798 infrared dye (available from Syntec, Germany), 0.5 g N-benzyl quinolinium bromide into 100 ml solvent mixture containing 30 ml methyl glycol, 25 ml methyl ethyl ketone, and 45 ml methanol. The solution was coated with a wire wound bar onto an EG, anodized and PVPA interlayered aluminum substrate and dried at 90° C. for 5 minutes to produce a uniform polymeric coating having a coating weight of 2.0 g/m$^2$.

The plate was imaged on a Creo-Trendsetter thermal plate setter, which is equipped with multiple diode laser beams producing radiation with a wavelength at about 830 nm, and an energy density between 160 and 400 mJ/cm$^2$ using a UGRA/FOGRA Postscript Control Strip version 1.1EPS. The plate is then immediately developed using Polychrome® 4005 aqueous developer to produce a high resolution printing image.

EXAMPLE 11

A polymeric coating was prepared by dissolving 7.5 g PD140A novolac resin, 1.3 g PMP-92 co-polymer, 0.6 g P3000 1,2-napthoquinone diazide polymer, 0.3 g Ethyl Violet, 0.4 g SpectraIR830 dye and 0.2 g CAP 482-05 cellulose acetate phthalate (available from Eastman Chemical Co., Kingsport, Tenn.), into 100 g solvent mixture containing 15% Dowanol PM, 40% 1,3-dioxolane and 45% methanol. The solution was coated with a wire wound bar onto an EG, anodized and PVPA interlayered aluminum substrate and dried at 90° C. for 5 minutes to produce a uniform polymeric coating having a coating weight of 2.0 g/m$^2$.

The plate was imaged on a Creo-Trendsetter thermal plate setter, which is equipped with multiple diode laser beams producing radiation with a wavelength at about 830 nm, and an energy density between 160 and 400 mJ/cm$^2$ using a UGRA/FOGRA Postscript Control Strip version 1.1EPS. The plate is then immediately developed using Polychrome® 2000M aqueous developer to produce a high resolution printing image.

EXAMPLE 12

A polymeric coating was prepared by dissolving 8.9 g PD140A novolac resin, 1.5 g PMP-92 co-polymer, 0.3 g Ethyl Violet, and 5.7 g ADS 1060A IR dye, into 100 g solvent mixture containing 15% Dowanol PM, 40% 1,3-dioxolane and 45% methanol. The solution was coated with a wire wound bar onto an EG, anodized and PVPA interlayered aluminum substrate and dried at 90° C. for 5 minutes to produce a uniform polymeric coating having a coating weight of 2.0 g/m$^2$.

The plate was imaged on a Gerber Crescent 42T thermal plate setter, which is equipped with a YAG laser producing radiation with a wavelength at about 1064 nm, and an energy density between 200 and 400 mJ/cm$^2$ using a UGRA/FOGRA Postscript Control Strip version 1.1EPS. The plate is then immediately developed using Polychrome® 2000M aqueous developer to produce a high resolution printing image.

COMPARATIVE EXAMPLE 13

A polymeric coating solution was prepared and coated on the EG-aluminum substrate as described in Example 7 to produce a uniform polymeric coating having a coating weight between 1.0 and 1.5 g/m$^2$.

The plate was imaged on the Creo-Trendsetter thermal plate setter, which is equipped with multiple diode laser beam having a wavelength at around 830 nm, at an energy density between 160 and 400 mJ/cm$^2$. The imaged plate was then passed through an oven at 125° C. and at a rate of 2.5 ft./min. (a residence time of about 1.5 minutes) and then cooled to room temperature. The heat-cycled plate was then immediately developed with Polychrome aqueous developer C110. Both the exposed and the unexposed areas of the imaged, heat-cycled plate were washed from the aluminum substrate.

COMPARATIVE EXAMPLE 14

A polymeric coating solution was prepared and coated on the EG-aluminum substrate as described in Example 7 to produce a uniform polymeric coating having a coating weight between 1.0 and 1.5 g/m$^2$.

The plate was imaged on the Creo-Trendsetter thermal plate setter, which is equipped with multiple diode laser beam having a wavelength at around 830 nm, at an energy density between 160 and 400 mJ/cm$^2$. The plate was allowed to stand at room temperature for 24 hours before development. The plate was then developed with Polychrome aqueous developer C110 to produce a high resolution printing image. However, the developed, exposed areas are slightly staining and pick up ink when run on press indicating incomplete development of exposed areas.

COMPARATIVE EXAMPLE 15

A polymeric coating solution was prepared and coated on the EG-aluminum substrate as described in Example 7 to produce a uniform polymeric coating having a coating weight between 1.0 and 1.5 g/m$^2$.

The plate was imaged on the Creo-Trendsetter thermal plate setter, which is equipped with multiple diode laser beam having a wavelength at around 830 nm, at an energy density between 160 and 400 mJ/cm$^2$. The plate was then heated in an oven at 60° C. for 5 minutes and then was allowed to stand at room temperature for 5 hours before development. The plate was then developed with Polychrome aqueous developer C110 to produce a high resolution printing image. However, the developed, exposed areas are slightly staining and pick up ink when run on press indicating incomplete development of exposed areas.

Those skilled in the art having the benefit of the teachings of the present invention as hereinabove set forth, can effect numerous modifications thereto. These modifications are to be construed as being encompassed within the scope of the present invention as set forth in the appended claims.

What is claimed is:

1. A positive working method for forming a lithographic printing surface consisting essentially of the following steps carried out in the order given:

(a) providing a lithographic printing plate comprising a support having a hydrophilic surface and an imaging layer applied to the hydrophilic surface, the imaging layer comprising;

(1) a polymer having a plurality of pendent groups bonded thereto wherein the pendent groups are selected from the group consisting of hydroxy, carboxylic acid, sulfonamide, amide, nitrile, urea, and combinations thereof; and (2) an infrared absorbing compound;

(b) imagewise exposing the imaging layer to infrared radiation to produce exposed areas which have transient solubility in an aqueous alkaline developing solution; and, (c) while the exposed areas have transient solubility, contacting the imaging layer with the aqueous alkaline developing solution to remove the exposed areas from the hydrophilic surface to form the lithographic printing surface comprised of unexposed image areas.

2. The method of claim 1 wherein the imaging layer is contacted with the aqueous alkaline developing solution within a time period of 20 hours from the imagewise exposing of the imaging layer.

3. The method of claim 1 wherein the the imaging layer is contacted with the aqueous alkaline developing solution within a time period of 120 minutes from the imagewise exposing of the imaging layer.

4. The method of claim 1 wherein the imaging layer is contacted with the aqueous alkaline developing solution immediately after imagewise exposing of the imaging layer.

5. The method of claim 1 wherein the infrared radiation is laser radiation.

6. The method of claim 5 wherein the laser radiation is digitally controlled to imagewise expose the imaging layer.

7. The method of claim 1 wherein the polymer is a phenolic polymer.

8. The method of claim 1 wherein the polymer is an acrylic or vinyl polymer selected from the group consisting of poly(vinyl phenol-co-2-hydroxyethyl methacrylate), poly(4-hydroxystyrene), poly(4-hydroxy-styrene/methymethacrylate), poly(styrene/butylmethacrylate/methyl/methacrylate/methacrylic acid), poly(butylmethacrylate/methacrylic acid), poly(vinylphenol/2-hydroxyethyl-methacrylate), poly(styrene/n-butyl-methacrylate/2-hydroxyethyl methacrylate/methacrylic acid), poly(N-methoxymethylmethylacrylamide/2-phenylethylmethacrylate/methacrylic acid), and poly(styrene/ethylmethacrylate/2-hydroxyethylmethacrylate/methacrylic acid).

9. The method of claim 1 wherein the imaging layer contains a second polymer having a plurality of pendent groups bonded thereto wherein the pendent groups are selected from the group consisting of 1,2-napthoquinone diazide, hydroxy, carboxylic acid, sulfonamide, amide, nitrile, urea, and combinations thereof.

10. The method of claim 9 wherein the second polymer is a phenolic polymer and the phenolic polymer has a plurality of pendent 1,2-napthoquinone diazide groups bonded thereto.

11. The method of claim 10 wherein the second polymer is a condensation polymer of pyrogallol and acetone, and the 1,2-napthoquinone diazide groups are bonded to the phenolic polymer through a sulfonyl ester linkage.

12. The method of claim 1 wherein the infrared absorbing compound is a dye and/or pigment having a strong absorption band in the region between 700 nm and 1400 nm.

13. The method of claim 1 wherein the infrared absorbing compound is selected from the group consisting of triarylamine dyes, thiazolium dyes, indolium dyes, oxazolium dyes, cyanine dyes, polyaniline dyes, polypyrrole dyes, polythiophene dyes, thiolene metal complex dyes, carbon black, and polymeric phthalocyanine blue pigments.

14. The method of claim 1 wherein the imaging layer contains a visible absorbing dye.

15. The method of claim 14 wherein the visible absorbing dye is selected from the group consisting of Victoria Blue R, Victoria Blue BO, Solvent Blue 35, Ethyl Violet, and Solvent Blue 36.

16. The method of claim 1 wherein the imaging layer contains a solubility inhibiting agent.

17. The method of claim 16 wherein the solubility inhibiting agent is an iodonium salt.

18. The method of claim 16 wherein the solubility inhibiting agent is an ammonium salt.

19. The method of claim 1 wherein the support is an aluminum substrate.

20. The method of claim 1 wherein the aqueous alkaline developing solution contains an amphoteric surfactant.

* * * * *